United States Patent [19]

Dijkmans

[11] Patent Number: 5,337,012
[45] Date of Patent: Aug. 9, 1994

[54] AMPLIFIER HAVING TEMPERATURE COMPENSATED BIAS CONTROL

[75] Inventor: Eise C. Dijkmans, Eindhoven, Netherlands

[73] Assignee: U.S. Philips Corporation, New York, N.Y.

[21] Appl. No.: 25,302

[22] Filed: Mar. 2, 1993

[30] Foreign Application Priority Data

Mar. 18, 1992 [EP] European Pat. Off. ......... 92200774.5

[51] Int. Cl.$^5$ ............................................. H03F 3/26
[52] U.S. Cl. ................................... 330/266; 330/267
[58] Field of Search .............. 330/263, 266, 267, 268, 330/289, 272, 273, 274

[56] References Cited

U.S. PATENT DOCUMENTS 4,313,082   1/1982   Neidorff .......................... 330/266 X

FOREIGN PATENT DOCUMENTS 6510718   8/1965   Netherlands .
1072947   6/1967   United Kingdom .

Primary Examiner—Steven Mottola
Attorney, Agent, or Firm—Bernard Franzblau

[57] ABSTRACT

An amplifier arrangement which includes a first and a second output transistor each having a base, a collector and an emitter. A bias stage generates a bias voltage between the bases of the first and the second output transistor. The emitters of the first and the second output transistors are coupled to an output terminal. The bias voltage has a negative thermal response, and one element (e.g. a transistor) of the bias stage is thermally coupled to the first and the second output transistor. In order to preclude thermal instability of the amplifier arrangement, the bias stage is adapted to generate a first voltage having a first negative thermal response by means of the one element of the bias stage and to generate a second voltage opposite to the first voltage and having a second negative thermal response. The bias voltage is equal to the sum of the first and the second voltages, the first voltage being larger in absolute value than the second voltage. The negative thermal response of the bias voltage is determined by the effect of the first and the second negative thermal response, and the first negative thermal response is larger in absolute value than the second negative thermal response.

14 Claims, 1 Drawing Sheet

AMPLIFIER HAVING TEMPERATURE COMPENSATED BIAS CONTROL

BACKGROUND OF THE INVENTION

This invention relates to an amplifier arrangement comprising a first and a second output transistor each having a base, a collector and an emitter, an input terminal, an output terminal, a first and a second supply terminal, and a bias stage for generating a bias voltage between the bases of the first and the second output transistors, the bases of the first and the second output transistors both being coupled to the input terminal, the collectors of the first and the second output transistors being coupled to the first and the second supply terminals respectively, the emitters of the first and the second output transistors being coupled to the output terminal, the bias voltage having a negative thermal response, and an element of the bias stage being thermally coupled to the first and the second output transistors In the present document a negative thermal response is to be understood to mean a thermal response resulting from a negative temperature coefficient.

Such an amplifier arrangement, which can be constructed by means of discrete components or as an integrated circuit, can be used in general for driving a load coupled to the output terminal in dependence upon an input signal applied to the input terminal.

Such an amplifier arrangement is known, inter alia, from the pre-published Netherlands Patent Application NL 65 10 718. In the known amplifier arrangement the bias stage comprises a resistor, a voltage divider having a first terminal, a tap and a second terminal, and a transistor having a base coupled to the tap of the voltage divider, a collector coupled to the first terminal of the voltage divider and to the base of the first output transistor, and an emitter coupled to the second terminal of the voltage divider and to the base of the second output transistor. The first terminal of the voltage divider is coupled to the first supply terminal by means of the resistor and the second terminal of the voltage divider is coupled to the second supply terminal by means of an input transistor coupled to the input terminal. In the known amplifier arrangement the voltage divider and the transistor function as a so-called base-emitter voltage multiplier, the bias voltage generated by the bias stage being equal to the product of a ratio defined by the voltage divider and the base-emitter voltage of the transistor, and the thermally coupled element of the bias stage being formed by the transistor. By means of the bias voltage applied between the bases of the output transistors the output transistors can be operated in class AB in order to reduce the distortion of the output signal, for which operation the bias voltage in the known amplifier arrangement should be approximately two times the base-emitter voltage of the transistor. As a result of the thermal coupling between the element formed by the transistor and the respective output transistors, the known amplifier arrangement is protected against an undesired influence of a temperature rise on the class AB operation. When the output transistors become warmer owing to a temperature rise, a current defined by the bias voltage and flowing through the output transistors will increase as a result of a physical property inherent in the output transistors. However, when the element constituted by the transistor becomes warmer owing to the temperature rise and the thermal coupling, the bias voltage in the case of an equal current through the transistor will decrease as a result of a physical property inherent in the transistor. As a consequence, the increase of the current through the output transistors is counteracted by a decrease of the bias voltage (the negative thermal response), so that a substantially temperature-independent class AB operation can be obtained in the case of an appropriate dimensioning.

However, a disadvantage of the known amplifier arrangement is that for the substantially temperature-independent class AB operation a perfect thermal coupling is a prerequisite. If the perfect thermal coupling is not achieved the current in the output transistors will increase despite a decrease of the bias voltage (the negative thermal response), which increase may give rise to thermal instability of the amplifier arrangement.

SUMMARY OF THE INVENTION

It is an object of the invention to provide an amplifier arrangement which precludes the occurrence of thermal instability.

An amplifier arrangement in accordance with the invention is characterised in that for generating the bias voltage, the bias stage is adapted to generate a first voltage having a first negative thermal response by means of the element of the first bias stage and to generate a second voltage opposite to the first voltage and having a second negative thermal response, the bias voltage being equal to the sum of the first and the second voltage, the first voltage being larger in absolute value than the second voltage, the negative thermal response of the bias voltage being determined by the effect of the first and the second negative thermal response, and the first negative thermal response being larger in absolute value than the second negative thermal response. The invention is based on the recognition of the fact that an overcompensation of the physical property inherent in the output transistors precludes thermal instability. In the amplifier arrangement in accordance with the invention the overcompensation is achieved in that the first voltage is opposite to the second voltage and in that the first negative thermal response is larger (in absolute value) than the second negative thermal response. Since the first voltage is opposite to the second voltage the bias voltage is equal to the first voltage minus the second voltage and the thermal response of the bias voltage is determined by the effect of the first negative thermal response on the first voltage minus the effect of the second negative thermal response on the second voltage. Since the first negative thermal response is larger (in absolute value) than the second negative thermal response the effect on the first voltage (in absolute value) is larger than the effect on the second voltage. As a result, the thermal response (in absolute value) of the bias voltage in the amplifier arrangement in accordance with the invention is larger than the thermal response of the bias voltage in the known amplifier arrangement (overcompensation) and the thermal response of the bias voltage in the amplifier arrangement in accordance with the invention is adjustable by means of the first and the second voltage. The thermal response of the bias voltage becomes more negative as the first voltage increases. Since the thermal response of the bias voltage is adjustable while the bias voltage remains the same, the overcompensation of the physical property inherent in the output transistors can be adjusted and thermal instability of the amplifier arrangement can be prevented.

A further embodiment of an amplifier arrangement in accordance with the invention is characterised in that the bias stage comprises at least one diode for the generation of the second voltage. When a current is passed through the at least one diode the diode will function as a current-controlled voltage source for the generation of the second voltage. Since the second voltage generated by the at least one diode is equal to the product of an integral number dictated by the number of diodes and a voltage corresponding to one base-emitter voltage, the at least one diode is advantageous in designing the amplifier arrangement. Depending upon the desired overcompensation one or more diodes may be used for generating the second voltage, the at least one diode not being thermally coupled to the output transistors in order to obtain the desired thermal response of the bias voltage. A resistor may be arranged in series with the at least one diode in order to obtain the bias voltage.

A further embodiment of an amplifier arrangement in accordance with the invention is characterised in that for generating the first voltage the bias stage comprises a current source, a voltage divider having a first terminal, a tap and a second terminal, and a transistor having a base, a collector and an emitter, the first terminal of the voltage divider being coupled to the first supply terminal by means of the current source, the second terminal of the voltage divider being coupled to the second supply terminal, the base of the transistor being coupled to the tap of the voltage divider, the collector of the transistor being coupled to the first terminal of the voltage divider by means of the diode and to the base of the first output transistor, the emitter of the transistor being coupled to the second terminal of the voltage divider and to the base of the second output transistor, and the transistor being the thermally coupled element of the bias stage. The present embodiment is an advantageous implementation of the amplifier arrangement in accordance with the invention, in which both the first and the second voltage are dictated by a current generated by the current source. This is because the current generated by the current source generates both the base-emitter voltage of the transistor, from which voltage the first voltage is derived by means of the voltage divider, and the second voltage across the diode. The specific thermal response of the present embodiment will be described in more detail in the following description with reference to the accompanying drawing.

A further embodiment of an amplifier arrangement in accordance with the invention is characterised in that the amplifier arrangement comprises a first and a second driver transistor each having a base, a collector and an emitter, the bases of the first and the second driver transistor being coupled respectively to the first and the second terminal of the voltage divider, the collectors of the first and the second driver transistors being coupled respectively to the first and the second supply terminals, and the emitters of the first and the second driver transistors being coupled respectively to the bases of the first and the second output transistors. By means of the bias stage of the amplifier arrangement in accordance with the invention the present embodiment can also be operated in class AB, the present embodiment being capable of providing a comparatively high gain as a result of the Darlington configuration of the driver transistors and the output transistors.

BRIEF DESCRIPTION OF THE DRAWING

The above and other (more detailed) features of the invention will now be described more elaborately with reference to the accompanying drawings, in which.

In these Figures like parts bear the same reference numerals.

DESCRIPTION OF THE PREFERRED EMBODIMENTS

Figure 1:
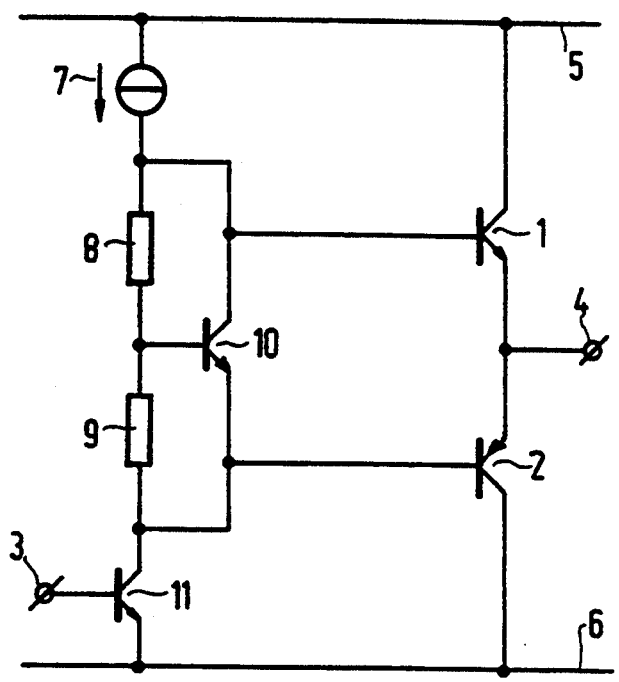
FIG. 1 shows a prior-art amplifier arrangement.

FIG. 1 shows a prior-art amplifier arrangement. The amplifier arrangement comprises a first (1) and a second (2) output transistor having a base, a collector and an emitter, an input terminal 3, an output terminal 4, a first (5) and a second (6) supply terminal, and a bias stage (7, 8, 9, 10) for generating a bias voltage between the bases of the first (1) and the second (2) output transistors, the bases of the output transistors 1 and 2 each being coupled to the input terminal 3, the collectors of the output transistors being coupled to the supply terminals 5 and 6, respectively, and the emitters of the output transistors each being coupled to the output terminal 4. In the amplifier arrangement the bias stage (7, 8, 9, 10) comprises a current source 7, which may be implemented for example by means of a resistor, a voltage divider (8, 9) having a first terminal, a tap and a second terminal, which voltage divider comprises for example two resistors 8 and 9, and a transistor (10) having a base, a collector and an emitter. The first terminal of the voltage divider (8, 9) is coupled to the supply terminal 5 by means of a current source 7 and the second terminal of the voltage divider is coupled to the supply terminal 6 by means of an input transistor 11. The base of the transistor 10 is coupled to the tap of the voltage divider (8, 9), the collector of the transistor 10 is coupled to the first terminal of the voltage divider (8, 9) and to the base of the output transistor 1, and the emitter of the transistor 10 is coupled to the second terminal of the voltage divider (8, 9) and to the base of the output transistor 2. One element (the transistor 10) of the bias stage (7, 8, 9, 10) is thermally coupled to the output transistors 1 and 2, and the voltage divider (8, 9) and the transistor 10 function as a so-called base-emitter voltage multiplier. The bias voltage generated by the bias stage (7, 8, 9, 10) is equal to a ratio defined by the voltage divider (8, 9) multiplied by the base-emitter voltage of the transistor 10. In order to minimise the distortion of an input signal applied to the input terminal 3, the output transistors 1 and 2 can be operated in class AB by means of the bias voltage applied between the bases of the output transistors 1 and 2, for which purpose the bias voltage should be equal to approximately twice the base-emitter voltage of the transistor 10. As a result of the thermal coupling between the output transistors 1 and 2 and the transistor 10, the relevant amplifier arrangement is protected against an adverse effect of a temperature rise on the class AB operation. When the output transistors 1 and 2 become warmer owing to a temperature rise, a current defined by the bias voltage and flowing through the output transistors will increase as a result of a physical property inherent in the output transistors. However, when the transistor 10 becomes warmer, owing to the thermal coupling the bias voltage in the case of a substantially equal current through the transistor 10 will decrease as a result of a physical property inherent in the transistor, so that a substantially temperature-independent class AB operation is obtained in the case of an appropriate dimensioning. When the amplifier arrangement is biassed appropriately, the input signal applied to the input terminal 3 is applied to the output transistors 1 and 2 by means of the input transistor 11. The voltage divider (8, 9) and the transistor 10 cause a d.c. level shift of a signal related to the input signal and the output transistors 1 and 2 respectively amplify a positive and a negative sinewave portion of the input signal. However, a disadvantage of the known amplifier arrangement is that a perfect thermal coupling is a prerequisite for the substantially temperature-independent class AB operation. If the thermal coupling is not perfect the current in the output transistors will increase despite a decrease of the bias voltage, which increase may give rise to thermal instability of the amplifier arrangement.

Figure 2:
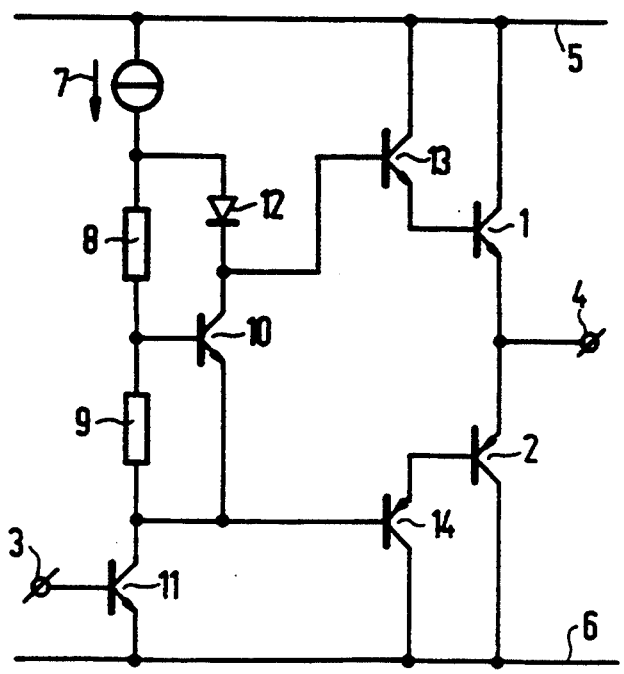
FIG. 2 shows an embodiment of an amplifier arrangement in accordance with the invention.

FIG. 2 shows an embodiment of an amplifier arrangement in accordance with the invention. This embodiment differs primarily from the amplifier arrangement shown in FIG. 1 in that a diode 12 has been added to the bias stage. The diode performs a function which is essential to the invention, for which purpose the diode is coupled between the first terminal of the voltage divider (8, 9) on the one hand and the base of the output transistor 1 and the collector of the transistor 10 on the other hand. The present embodiment further differs from the amplifier arrangement shown in FIG. 1 in that the amplifier arrangement in addition comprises a first (13) and a second (14) driver transistor having a base, a collector and an emitter, the bases of the driver transistors 13 and 14 being coupled respectively to the first and the second terminal of the voltage divider (8, 9), the collectors of the driver transistors 13 and 14 being coupled respectively to the supply terminals 5 and 6, and the emitters of the driver transistors 13 and 14 being coupled respectively to the bases of the output transistors 1 and 2. The driver transistors 13 and 14 have been added merely to illustrate the fact that the output transistors 1 and 2 can be included in the amplifier arrangement in several manners, as is known to the expert. In the present embodiment of an amplifier arrangement in accordance with the invention, the current source 7 generates a current through the transistor 10 and the diode 12. The transistor 10, in contradistinction to the diode 12, is thermally coupled to the output transistors 1 and 2. On the basis of the current the transistor 10 generates a first voltage having a first negative thermal response by means of the voltage divider (8, 9), and the current generates across the diode 12 a second voltage having a second negative thermal response, the bias voltage across the transistor 10 being equal to the sum of the first and the second voltage, the first voltage being larger in absolute value than the second voltage, the negative thermal response of the bias voltage being determined by the effect of the first and the second negative thermal response, and the first negative thermal response being larger in absolute value than the second negative thermal response. In the amplifier arrangement in accordance with the invention, thermal instability is precluded by overcompensation of the physical property inherent in the output transistors 1 and 2. In the amplifier arrangement in accordance with the invention overcompensation is achieved in that the first voltage is opposite to the second voltage (in the case of FIG. 2 in that the diode 12 is added) and in that the first negative thermal response is larger (in absolute value) than the second negative thermal response (in the case of FIG. 2 in that the diode 12 is not thermally coupled). Since the first voltage is opposite to the second voltage the bias voltage is equal to the first voltage minus the second voltage and the thermal response of the bias voltage is determined by the effect of the first negative thermal response on the first voltage minus the effect of the second negative thermal response on the second voltage. Since the first negative thermal response is larger (in absolute value) than the second negative thermal response the effect on the first voltage is larger (in absolute value) than the effect on the second voltage. As a result, the thermal response of the bias voltage in the amplifier arrangement in accordance with the invention is larger (in absolute value) than the thermal response of the prior-art amplifier arrangement (overcompensation) and the thermal response of the bias voltage is adjustable by means of the first and the second voltage. Since the thermal response of the bias voltage is adjustable the overcompensation of the physical property inherent in the output transistors can be adjusted and thermal instability of the amplifier arrangement can be prevented. Thus, an increase of the current flowing through the output transistors 1 and 2 as a result of a temperature rise is compensated (overcompensated) by means of an ample decrease of the bias voltage. An additional advantage of the present embodiment is that the transistor 10 and the diode 12 have a similar thermal response to a rise of the ambient temperature but a different thermal response to a temperature rise as a result of the output transistors 1 and 2. Since the transistor 10 and the diode 12 have the same temperature coefficient, the setting of the output transistors 1 and 2 will not change in the case of a rise in ambient temperature, but (owing to the thermal coupling of the output transistors 1 and 2 and the transistor 10) it will change in the case of a temperature rise as a result of a current in the output transistors 1 and 2.

The invention is not limited to the embodiments shown herein. Within the scope of the invention several modifications would be conceivable to those skilled in the art. Thus, the first voltage need not be generated in the manner as shown in FIG. 2, but the first voltage can be generated, for example, by means of a current passed through one or more diodes. The second voltage also need not be generated in the manner as shown in FIG. 2 by means of the at least one diode or diode-connected transistor). The second voltage may be generated, for example, by means of a current passed through a resistor, although the thermal response caused by the resistor deviates disadvantageously from the first thermal response.

I claim:

1. An amplifier arrangement comprising a first and a second output transistor each having a base, a collector and an emitter, an input terminal an output terminal, a first and a second supply terminal, and a bias stage for generating a bias voltage between the bases of the first and the second output transistor, the bases of the first and the second output transistor being coupled to the input terminal, the collectors of the first and the second output transistor being coupled to the first and the second supply terminal, respectively, the emitters of the first and the second output transistor being coupled to the output terminal, the bias voltage having a negative thermal response, and an element of the bias stage being thermally coupled to the first and the second output transistor, wherein for generating the bias voltage the bias stage is adapted to generate a first voltage having a first negative thermal response by means of the element of the first bias stage and to generate a second voltage opposite to the first voltage and having a second negative thermal response, the bias voltage being equal to the sum of the first and the second voltage, the first voltage being larger in absolute value than the second voltage, the negative thermal response of the bias voltage being determined by the effect of the first and the second negative thermal response, and the first negative thermal response being larger in absolute value than the second negative thermal response.

2. An amplifier arrangement as claimed in claim 1, wherein the bias stage comprises at least one diode for the generation of the second voltage.

3. An amplifier arrangement as claimed in claim 2, wherein for generating the first voltage the bias stage comprises a current source, a voltage divider having a first terminal, a tap and a second terminal, said element being a transistor having a base, a collector and an emitter, the first terminal of the voltage divider being coupled to the first supply terminal by means of the current source, the second terminal of the voltage divider being coupled to the second supply terminal, the base of the transistor being coupled to the tap of the voltage divider, the collector of the transistor being coupled to the first terminal of the voltage divider by means of the diode and to the base of the first output transistor, and the emitter of the transistor being coupled to the second terminal of the voltage divider and to the base of the second output transistor.

4. An amplifier arrangement as claimed in claim 3 which further comprises, a first and a second driver transistor each having a base, a collector and an emitter, the bases of the first and the second driver transistor being coupled respectively to the first and the second terminal of the voltage divider, the collectors of the first and the second driver transistor being coupled respectively to the first and the second supply terminal, and the emitters of the first and the second driver transistor being coupled respectively to the bases of the first and the second output transistor.

5. An amplifier arrangement as claimed in claim 4 which further comprises; an input transistor having a base, a collector and an emitter, the base of the input transistor being coupled to the input terminal, the collector of the input transistor being coupled to the second terminal of the voltage divider, and the emitter of the input transistor being coupled to the second supply terminal.

6. A temperature stabilized amplifier circuit comprising:
first and second supply voltage terminals for the amplifier circuit,
first and second output transistors connected in series circuit to said first and second supply voltage terminals,
an output terminal coupled to a circuit point in said series circuit between said first and second output transistors,
a signal input terminal coupled to respective control electrodes of the first and second output transistors, and
a bias voltage stage for deriving a bias voltage having a negative thermal response between the control electrodes of the first and second output transistors, wherein said bias voltage stage comprises;
a temperature-dependent semiconductor element thermally coupled to the first and second output transistors, and
circuit means including said temperature-dependent semiconductor element, said circuit means generating a first voltage having a first negative thermal response by means of said temperature-dependent semiconductor element and further generating a second voltage opposite to the first voltage and having a second negative thermal response, the absolute value of the first negative thermal response being greater than that of the second negative thermal response and the absolute value of the first voltage being greater than that of the second voltage, and wherein the bias voltage is the sum of the first and second voltages.

7. An amplifier circuit as claimed in claim 6 wherein the circuit means of the bias voltage stage further comprises;
a current source and a voltage divider serially coupled to the first and second supply voltage terminals,
said temperature-dependent semiconductor element comprising a transistor coupled between the control electrodes of the first and second output transistors and having a control electrode coupled to a tap point on the voltage divider, said transistor being thermally coupled to the first and second output transistors, and
a diode coupled to said current source and to said transistor.

8. An amplifier circuit as claimed in claim 7 further comprising;
an input transistor coupled between the voltage divider and the second supply voltage terminal and with a control electrode coupled to the signal input terminal.

9. An amplifier circuit as claimed in claim 7 wherein said diode and said transistor are connected in a second series circuit across end terminals of the voltage divider.

10. An amplifier circuit as claimed in claim 9 wherein a node between said diode and said transistor is coupled to the control electrode of the first output transistor and a further node between the transistor and one end terminal of the voltage divider is coupled to the control electrode of the second output transistor.

11. An amplifier circuit as claimed in claim 6 wherein the circuit means of the bias voltage stage further comprises;
a current source and a diode coupled to the first supply voltage terminal such that the diode functions as a current-controlled voltage source for generating the second voltage.

12. An amplifier circuit as claimed in claim 6 wherein the circuit means of the bias voltage stage further comprises;
a current source and a voltage divider serially coupled to the first and second supply voltage terminals,
said temperature-dependent semiconductor element comprising a transistor coupled between the control electrodes of the first and second output transistors and having a control electrode coupled to a tap point on the voltage divider, the current source and a diode being serially coupled to the first supply voltage terminal and to the transistor in a manner such that the diode generates the second voltage and the first and second voltages are at least partly determined by the current of the current source.

13. An amplifier circuit as claimed in claim 6 wherein the circuit means of the bias voltage stage further comprises;
- a current source and a voltage divider serially coupled to the first and second supply voltage terminals,
- said temperature-dependent semiconductor element comprising a transistor coupled between the control electrodes of the first and second output transistors and having a control electrode coupled to a tap point on the voltage divider,
- a diode coupled in series with the transistor across the voltage divider and in series with the current source and the transistor to the first supply voltage terminal, and wherein
- the transistor and the diode have a similar thermal response to a rise of ambient temperature.

14. An amplifier circuit as claimed in claim 6 wherein the circuit means of the bias voltage stage further comprises;
- a current source and a voltage divider serially coupled to the first and second supply voltage terminals,
- said temperature-dependent semiconductor element comprising a single transistor coupled between the control electrodes of the first and second output transistors and having a control electrode coupled to a tap point on the voltage divider, and
- a diode coupled to said current source and to said transistor.

* * * * *